' }

United States Patent [19]

Koreicho et al.

[11] 4,134,007
[45] Jan. 9, 1979

[54] ONE-WAY TRANSMISSION SYSTEM

[75] Inventors: Wladimir Koreicho, Chilly-Mazarin; Pierre M. L. Lamelot, Ville D'Avray, both of France

[73] Assignee: Societe Anonyme de Telecommunications, Paris, France

[21] Appl. No.: 797,873

[22] Filed: May 17, 1977

[30] Foreign Application Priority Data

May 21, 1976 [FR] France .................... 76 15411

[51] Int. Cl.² ........................................ H04B 9/00
[52] U.S. Cl. ................... 250/199; 250/237 R; 362/308
[58] Field of Search ............ 362/308, 309, 310; 250/199, 237 R

[56] References Cited

U.S. PATENT DOCUMENTS

| 2,014,039 | 9/1935 | Cole | 362/308 |
| 2,484,837 | 10/1949 | Lake | 250/199 |
| 3,031,351 | 4/1962 | McIlvaine | 250/237 |
| 3,242,340 | 3/1966 | Layne | 250/199 |
| 3,620,626 | 11/1971 | Daly et al. | 250/199 |

FOREIGN PATENT DOCUMENTS

| 2342345 | 8/1973 | Fed. Rep. of Germany | 250/199 |
| 2431937 | 7/1974 | Fed. Rep. of Germany | 250/199 |
| 2453077 | 5/1976 | Fed. Rep. of Germany | 250/199 |
| 1040050 | 10/1953 | France | 250/199 |

OTHER PUBLICATIONS

Free-Cordless Headphones - Jan. 1976 - Popular Science p. 91.
Freeman et al. - A short Range Optical Transmission System for Television Signals-Optical Engineering-vol. 13 # 5, Sep., Oct. 1974, pp. 396-400.
Lowe - Hot Idea in Headphones - Design News -vol. 30, Sep. 22, 1975 - p. 48.

*Primary Examiner*—Robert L. Richardson
*Assistant Examiner*—Joseph A. Orsino, Jr.
*Attorney, Agent, or Firm*—Holman & Stern

[57] ABSTRACT

A system for transmitting alignment data from the turret of an aircraft carrier to aircrafts stationed on the flight deck, comprising optical transmitters with modulable beams placed on the turret, means for modulating the transmitter beam from the data, an optical detector placed on each aircraft and means for demodulating the output signal of the detector, wherein each transmitter comprises a plurality of infrared electroluminescent diodes and means for changing the beam from the diodes into a beam which is substantially horizontal with an angle of site of a few degrees, the transmitters being arranged in such a manner that the adjacent transmitter beams overlap to a large extent and the optical detector is omnidirectional in the horizontal plane.

5 Claims, 8 Drawing Figures

ONE-WAY TRANSMISSION SYSTEM

BACKGROUND OF THE INVENTION

The present invention relates to a system for transmitting alignment data from the turret of an aircraft carrier to aircrafts which are stationed on the flight deck ready for takeoff.

An initial alignment of the airborne navigation instruments on the aircrafts such as the inertia data computer is indeed necessary and each aircraft must receive from the turret the data defining the aircraft carrier reference system, that is the speed components, the position (latitude and longitude), the course, the pitch and the roll of the ship.

In order that the transmission takes place under the best conditions of discretion and military security, the transmitting field should be adjusted as narrowly as possible to the flight deck so that the transmitted information can be received only within or in the immediate vicinity of the flight deck. Furthermore, the reception should be excellent at any point of the flight deck and immune to extraneous interferences.

SUMMARY OF THE INVENTION

There is provided according to the invention a transmission system comprising optical transmitters with modulable beams placed on the turret, means for modulating the transmitter beams from said data, an optical detector placed on each aircraft and means for demodulating the output signal of said detector, wherein each transmitter comprises a plurality of infrared electroluminescent diodes and means for changing the beam from the diodes into a substantially horizontal beam with an angle of sight of a few degrees, the transmitters are arranged in such a manner that the beams from adjacent transmitters overlap to a large extent and the optical detector is omnidirectional in the horizontal plane.

The transmission system according to the invention ensures an almost absolute discretion since the detection law of the incoherent radiation emitted by the electroluminescent diodes is in the form $1/d^2$ (d being the distance to the transmitter). The attenuation is thus quickly very high and the transmission field can be limited to correspond substantially to the flight deck of the aircraft carrier.

This accurate delimitation of the transmission field would not be possible with a radioelectric transmission, since in the case of a coherent radiation, the detection law is in the form $1/d$ and the attenuation is far slower.

The utilization of an incoherent radiation further allows illuminating a point of the flight deck by two or more transmitters without any problem whereas the use of several coherent radiation sources would cause interference phenomena which would disturb the reception. It is also possible to vary the lighting simply by modifying the number of diodes of each optical transmitter.

A further advantage of the present transmission system is that an intentional jamming of the reception is practically impossible with the wavelength used.

According to a feature of the invention, the power of the optical transmitters is such that the area where a detection is possible corresponds substantially to the flight deck of the aircraft carrier.

The number of electroluminescent diodes in each transmitter and the type of the diodes used are chosen to ensure an excellent reception, even in foggy weather, in the areas of the flight deck most remote from the turret. Yet, it should be pointed out as regards fog that the visibility should be sufficient to allow landing of the aircrafts on the flight deck.

In one embodiment, each optical transmitter comprises a plurality of electroluminescent diodes arranged on the line focus of a parabolic mirror opposite said mirror.

A beam is thereby obtained with a bearing of about 100° and a site of about 2°. The beam lack of parallelism which is involved by a site of about 2° results from the fact that the diodes are not perfect punctual sources. A parallel beam would be disadvantageous as it would compel to adjust the height of the optical detectors to a precise value, whereas a slightly diverging beam ensures a good reception even with detectors positioned at slightly different heights.

On the other hand, the reception should not be interfered with by solar radiation of same wave length. To this effect, each detector comprises photo-diodes forming the lateral faces of a regular prism with vertical axis, and horizontal plates regularly spaced apart about said prism, the distance between adjacent plates and their length being such that the photodiodes are protected against radiations incoming under an angle superior to an angle of site between 5 and 10°, preferably 7.5°.

A solar radiation incoming under an angle lower than 7.5° corresponds to sunrise or sunset and is too weak to disturb reception.

BRIEF DESCRIPTION OF THE DRAWINGS

The invention will become more apparent from the following description of an exemplary embodiment thereof, taken in conjunction with the accompanying drawings, in which.

DETAILED DESCRIPTION OF PREFERRED EMBODIMENTS

Figure 1:
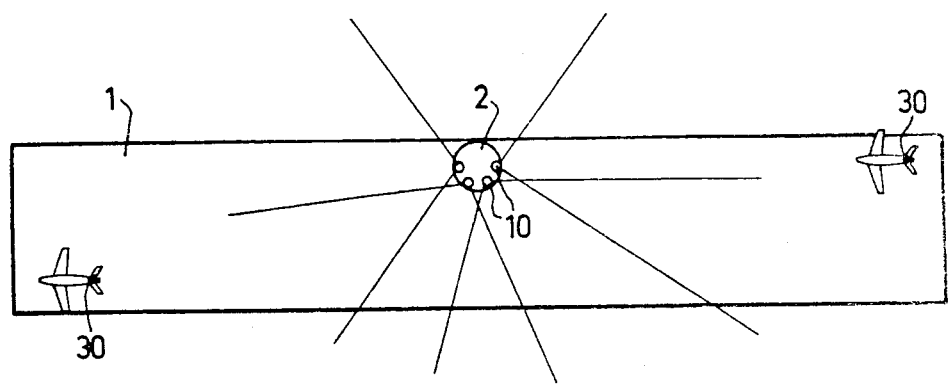
FIG. 1 is a schematic plan view of the turret and of a possible arrangement of the optical members of the system.

FIG. 1 shows schematically an aircraft carrier comprising a flight deck 1 and a turret 2. Aircrafts may be stationed at all points of the flight deck. The dimensions of the flight deck may be for instance 20 meters in width and 250 meters in length.

Turret 2 carries four optical transmitters or beacons 10, the sources of which are provided by AsGa electroluminescent diodes radiating in the near infrared band (0.95 μm), beacons 10 being arranged so that the totality of the flight deck is lit by the beacon beams. On the other hand, each aircraft carries on its fin an optical detection head 30 responsive to the infrared radiation transmitted by beacons 10. In practice, beacons 10 and detection heads 30 are about at the same level, from 4 to 5 meters above flight deck 1.

A beacon 10 and a detection head 30 will now be described in more detail, and thereafter the transmitting electronics which elaborate from the alignment data a modulation signal for the optical beam transmitted by beacons 10, and the reception electronics which process the detection head 30 output signal in order to render it available aboard the aircraft will also be described.

Figure 2:
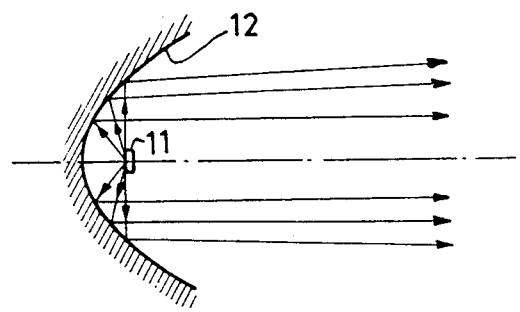
FIG. 2 is a simplified cross-sectional view of an embodiment of the optical transmitter.

In a first embodiment shown in FIG. 2, each beacon comprises a series of electroluminescent diodes 11 and a parabolic mirror 12, the diodes being arranged on the line focus of mirror 12 and transmitting in its direction. Due to this fact, the beam reflected by the mirror is almost parallel. The slight divergence of the beam is the result of the fact that the diodes 11 are not perfect punctual sources.

Mirror 12 is positioned with its generating lines horizontal, and consequently the divergence of the corresponding beam corresponds to the angle of site. The divergence is about 2° corresponding to about one meter at 60 meters from the beacon. This divergence is advantageous since it does not compel to set with great accuracy the height of detection head 30 in relation to deck 1.

The beam bearing angle, as may be seen from FIG. 1, is about 100°. It is seen that with four beacons of this type, the greater part of the flight deck is illuminated by at least two beacons. Since the radiation transmitted by the AsGa diodes is incoherent, the beams from the various beacons add up to each other without any interference problems.

For the same reason, the number of diodes to be provided on each beacon may be freely chosen in relation to the required radiation intensity. Each beacon may comprise for instance eight diodes.

Figure 3:
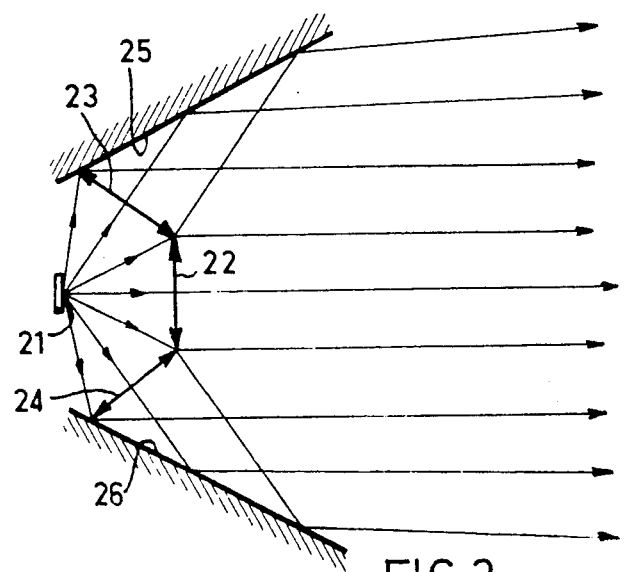
FIG. 3 is a schematic view of a further embodiment of the optical transmitter.
Figure 4:
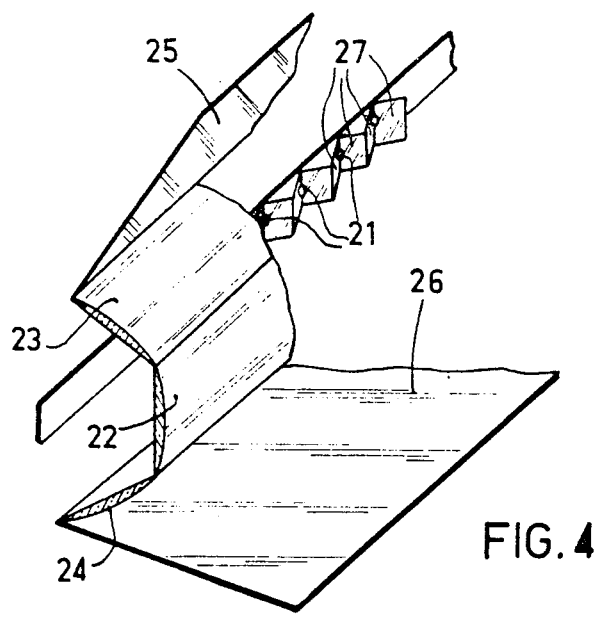
FIG. 4 is a perspective view partially broken away of the transmitter of FIG. 3.

A further embodiment of the beacon is shown in FIGS. 3 and 4. The beacon comprises a series of AsGa diodes 21, for instance four diodes arranged along a horizontal line which now radiate in the direction of the flight deck. The beam emitted by diodes 21 is concentrated by a cylindrical lens 22 and by two upper and lower cylindrical lens 23, 24 respectively associated with two mirrors 25, 26. The resulting beam has an angle of site of about 2°, as with the beacon of FIG. 2, but the bearing angle is of the order of 50°, and for this reason it is necessary to associate two of these beacons in order to obtain a bearing coverage similar to that provided by the beacon of FIG. 2.

In order to use to the maximum the beam emitted by diodes 21, there is further provided a series of small mirrors arranged in a crenel pattern 27 as shown in FIG. 4, in such a manner as to send back the diode lateral radiations towards the lens. On either side of each diode 21 are arranged two mirrors 27 forming a dihedron. The radiation intensity is thereby substantially increased for a given number of diodes.

Figure 5:
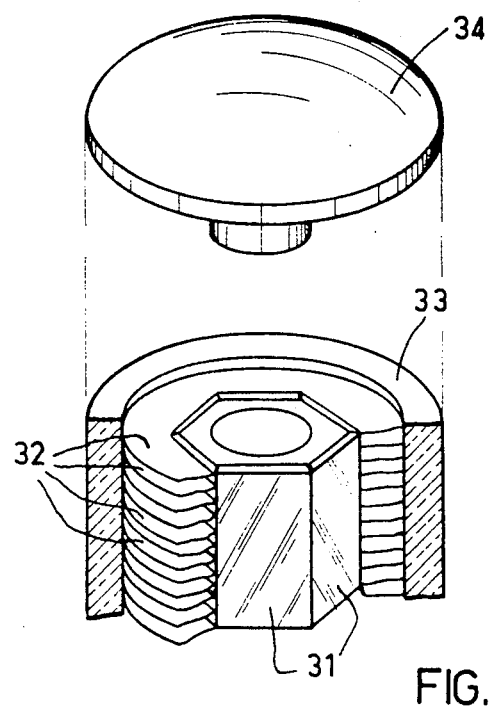
FIG. 5 is a schematic perspective view partially broken away of an embodiment of the optical detector.

The optical detection head 30 which is mounted on the fin of each aircraft is schematically shown in FIG. 5. The detection head is made of six identical photocells 31 arranged in such a manner as to form the lateral faces of a regular hexagonal prism. The terminals of photocells 31 have not been shown, but the cells are simply mounted in parallel in order that the currents provided are added to each other. Photocells 31 are advantageously coated with a sprayed layer of CdTe which restricts the detection spectrum to the wave length of 0.95 μm transmitted by the AsGa diodes, the CdTe layer being itself coated with an anti-reflection layer which increases the sensitivity. This structure of the photocell is conventional and more detailed explanations are not necessary.

The arrangement described for the photocells 31 provides an omnidirectional reception, and thus reception is ensured whatever the position of the aircrafts on the flight deck.

The prism formed by photocells 31 is surrounded by a set of parallel opaque plates 32 regularly spaced apart. These plates play the role of shutters since the distance separating two consecutive plates and the radial distance between their periphery and the photocell are calculated for preventing radiation incoming under an angle of site superior to 7.5° from impinging on the photocell 31.

The plates 32 prevent solar radiations from disturbing the reception, but transmit the beam from beacon 10 which is substantially horizontal. It should be noted that when the sun is at an angle of site lower than 7.5°, the solar radiation is negligible in relation to the radiation from beacon 10.

The optical head 30 is further protected by a casing 33 which is transparent to the infrared radiation from the AsGa diodes and covered by a cap 34.

Figure 6:
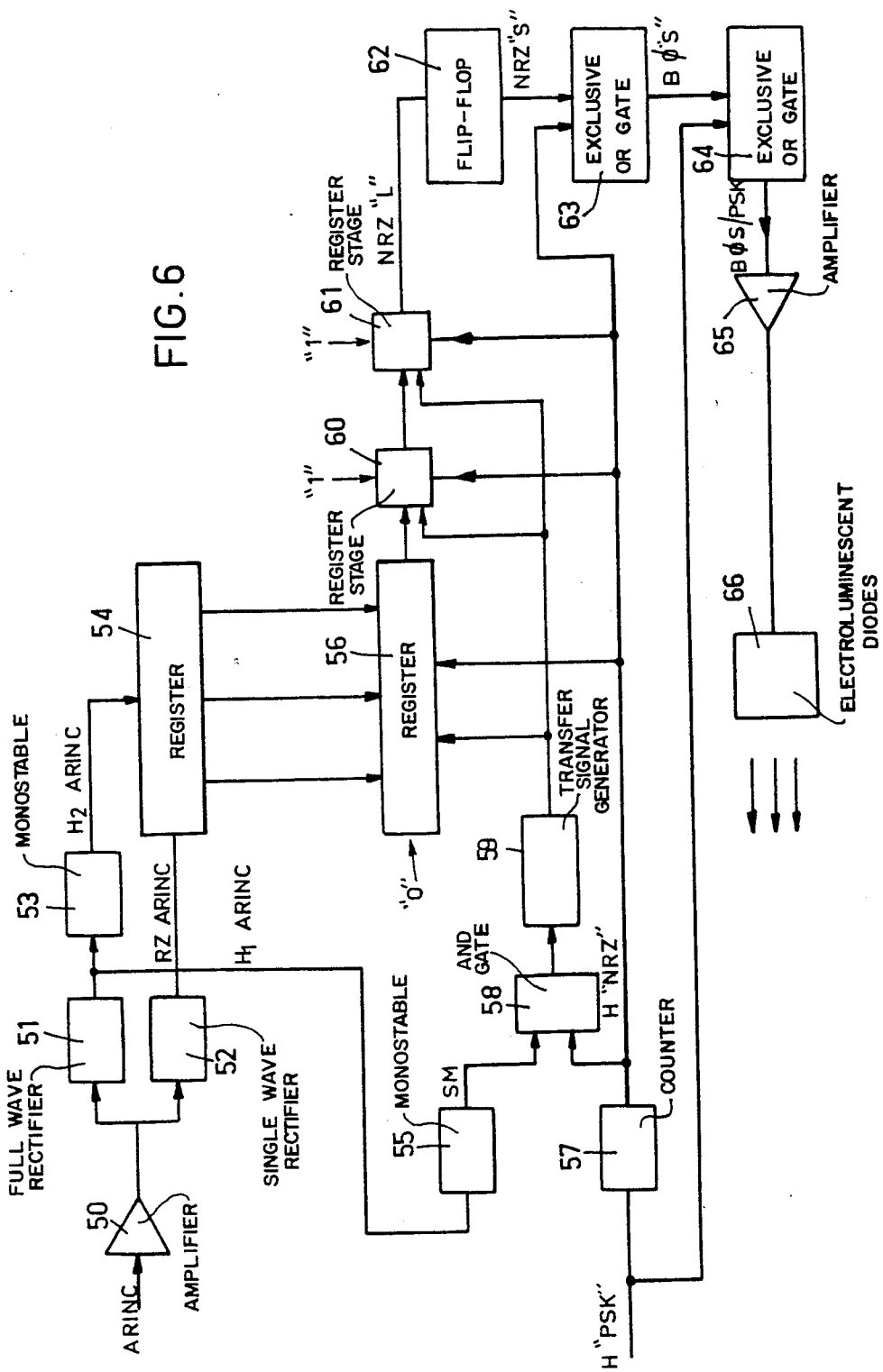
FIG. 6 is a block diagram of the circuit which supplies the modulation signal to the optical transmitter from a signal delivered by the turret.
Figure 7:
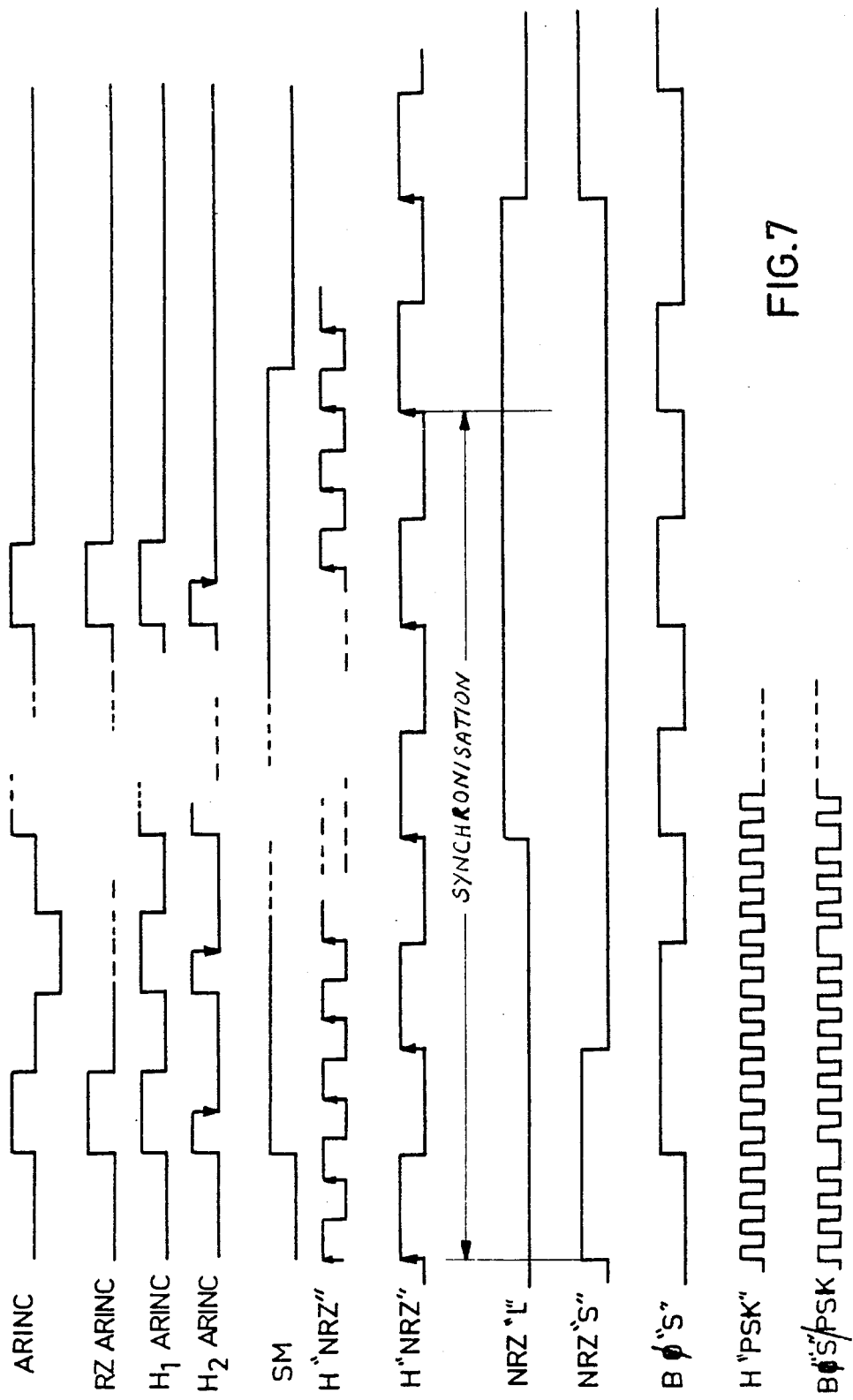
FIG. 7 is a time chart corresponding to the circuit of FIG. 6.

Reference being made to FIGS. 6 and 7, the way in which the modulation signal for the beam transmitted by the electroluminescent diodes is obtained will now be described.

The alignment information is supplied by the turret in the form of an ARINC signal (see FIG. 7), that is a signal made of 32-bit words transmitted by bursts at a variable bit rate between 6 and 14 kBd. In each interval separating two consecutive words, the signal is zero. The ARINC signal transmission is the usual transmission mode aboard aircrafts and aboard aircraft carriers.

This signal cannot be used as such for modulating the optical beam as a modulation signal should in fact have a regular rate and comprise synchronization words. The circuit shown in FIG. 6 provides such modulation signal.

The ARINC signal is passed through an amplifier 50 and is fed, on the one hand, to a full wave rectifier 51 which supplies a $H_1$ signal, and on the other hand to a single wave recitifier 52 which supplies a RZ ARINC signal.

A monostable element 53 derives from the $H_1$ ARINC signal a $H_2$ ARINC signal which is entered in a buffer register 54. On the other hand, the $H_1$ ARINC signal triggers a re-releasable monostable element 55 the output signal of which SM falls back to the zero level some time after the end of a word. It is therefore the signal of the end of a word which, as will be seen, operates the parallel transfer of the contents of register 54 into a register 56. The output rate from register 56 is provided by a H "NRZ" clock signal of frequency 14.5 kHz, obtained by dividing by 8 in a counter 57 a H "PSK" clock signal frequency of 116 kHz. This signal is shown with two different scales in FIG. 7.

The H "NRZ" clock signal and the SM end of word signal delivered by the monostable element 55 are applied to a AND gate 58, and the resulting signal is applied to a device 59. Device 59 delivers a signal which operates the transfer of the content of register 54 into register 56 when the first transition of the signal from gate 58 appears. The transfer is thereby in phase with the H "NRZ" clock signal.

Register 56 is followed by two register stages 60, 61 which are set on value "1" when they receive the operating signal from device 59. The H "NRZ" signal supplies the shifting rate between register 56 and stages 60 and 61.

The resulting NRZ "L" signal has therefore a constant bit rate of 14.5 kbits/s and comprises two bits of value "1" immediately preceding the 32-bit information word, the two bits of value "1" being preceded by at least two bits of value "0" due to the structure of the starting ARINC signal. The 0011 pattern thus obtained forms the synchronization word.

The NRZ "L" signal is not directly used as a modulation signal, since its rate is only 14.5 kbits/s. It is therefore of interest to employ the highest possible frequency to avoid interferences with ambient noise caused in particular by aircraft jets. To this effect, the NRZ "L" signal is applied to a flip-flop 62 which supplies a NRZ "S" signal (FIG. 7) which provides transitions only for the zero values of NRZ "L", and the NRZ "S" signal as well as the NRZ clock signal are applied to a OR exclusive gate 63, which delivers a B$\phi$ "S" signal. The B$\phi$ "S" signal is applied to a OR exclusive gate 64 as well as the H "PSK" clock signal at 116 kHz, which provides a phase inversion modulation of signal H "PSK". Signal B$\phi$ "S"/PSK is thereby obtained which, once being passed through an amplifier 65, is applied to the electroluminescent diodes shown at 66 for on-off modulating the optical beam.

Figure 8:
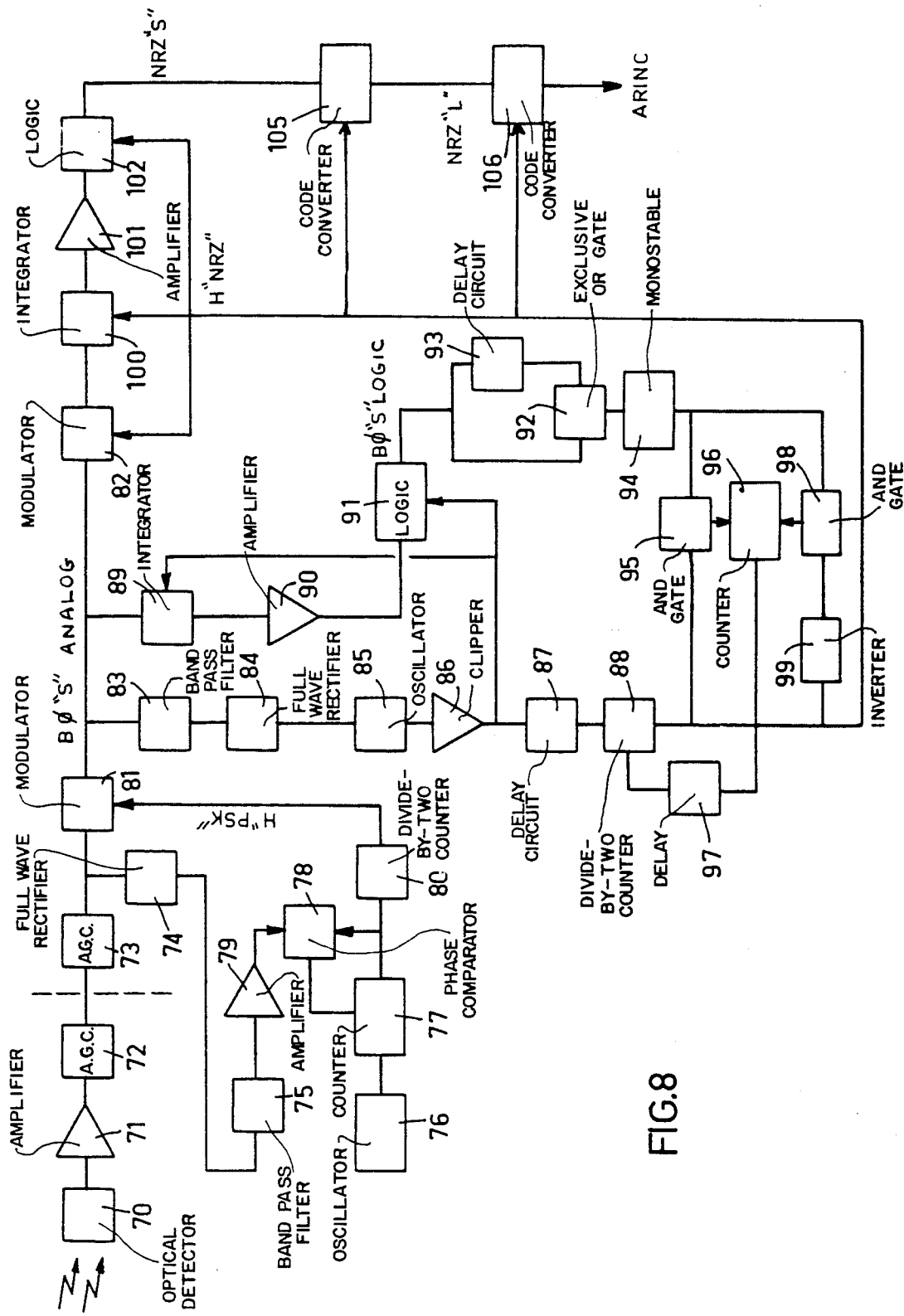
FIG. 8 is a block diagram of the demodulation circuit for processing the optical detector output signal.

The description will now be given, with reference to FIG. 8, of the demodulation circuit which provides from the output signal of the optical detector, an ARINC type signal which is usable aboard an aircraft.

Reference numeral 70 symbolizes an optical detector such as described hereabove. Once it has been amplified in a low noise amplifier 71 placed in the vicinity of detector 70, the output signal has an extremely variable level due to the fact that the distance between the aircraft and the turret may vary from 5 meters to 120 meters, and that fog may considerably attenuate the radiation intensity. At the maximum, a ratio of the order of 1:100,000 may be had between the lowest level and the highest level of the signal.

For this reason, an automatic gain control device 72 (A.G.C.) is also provided on the fin, which supplies a signal with a level variation compatible with the wire transmission. However, the A.G.C. 72, due to its very wide dynamic range, has an important time constant and cannot absorb the fast level variations which appear when the beam crosses the turbulences caused by the aircraft jets in operation and which a frequency of a few hundreds of Hertz. There is thus provided aboard the aircraft, a second A.G.C. 73 of narrower dynamic range (1:5–10) but with a faster time constant, and which is therefore capable of absorbing the aforementioned fast variations. These devices are conventional and need no detailed description. It will be noted that, in FIG. 8, the elements shown on the left hand side in dotted lines are arranged on the fin and that the elements shown on the right hand side in dotted lines are aboard the aircraft.

For regenerating the NRZ "S" signal formed at the transmitting end, the operations which are to be carried out are the reverse of those which are carried out by gates 63 and 64 of FIG. 6, and to this effect the clocks which were used for the elaboration of the modulation signal, that is the H "PSK" (116 kHz) and the H "NRZ" (14.5 kHz) signals have to be recovered.

The recovery of the PSK clock signal is carried out as follows. The A.G.C. 73 output signal is passed through a full wave rectifier 74. The rectified signal is then filtered in a bandpass filter 75 at 232 kHz (2 × 116 kHz). On the other hand, an oscillator 76 supplies a 7192 kHz frequency signal which is applied to a counter 77. Said counter divides either by 30 or by 32, and is piloted by a phase comparator 78 which continuously compares the signal from filter 75 which is amplified by an amplifier 79 and the signal from counter 77. Counter 77 delivers consequently a signal of frequency 232 kHz transformed into a H "PSK" signal of frequency 116 kHz after being passed through a divide-by-2 counter 80.

The H "PSK" clock signal is used for switching a balanced modulator 81 which receives signal B$\phi$ "S"/PSK from the A.G.C. 73 and amplifies it with a gain + 1 or − 1 according to the level of signal H "PSK". Modulator 81 therefore regenerates the "analog" B$\phi$ "S" signal, that is vitiated by various noises.

The next operation is to recover the H "NRZ" clock signal intended to switch a second balanced modulator 82 receiving the B$\phi$ "S" signal and delivering the NRZ "S" signal at its output.

A clock recovery circuit comprises in this case a bandpass filter 83 of central frequency 14.5 kHz, a full wave rectifier 84, an oscillating circuit 85 set on 29 kHz, a clipper circuit 86, a delay circuit 87 for phase reset and a divide-by-2 counter 88 supplying a signal at 14.5 kHz.

However, the multiplication of the frequency by 2 followed by a division by 2 have introduced a doubt in the H "NRZ" signal phase. For removing this doubt, the fact is used that the B$\phi$ "S" signal always presents a transition in the middle of one bit (see FIG. 7).

The signal from modulator 81 which is carrying various noises is first processed into a pure logic signal. This processing consists in applying the signal to an integrator 89 reset to zero at frequency 29 kHz. The sign of the result of the integration is supplied by an amplifier 90 of a logic circuit 91 which delivers bit "1" when the result is positive and a "0" value bit when the result is negative.

The B$\phi$ "S" signal thus obtained is applied to an exclusive OR gate 92 which receives also the B$\phi$ "S" signal shifted by half a bit delivered by a delay circuit 93. The output signal of gate 92 has its transitions always at the beginning of a period and can therefore be compared, after being passed through a monostable element 94, with the signal delivered by counter 88 in an AND gate 95. When the AND gate 95 has delivered three pulses, a counter 96 delivers a signal which operates the phase shifting of the H "NRZ" signal by half a period through a delay circuit 97. For more security, the signal from counter 88 is also applied to an AND gate 98 after inversion at 99, the AND gate 98 receiving also a signal from counter 88 and delivering pulses to counter 96. The phase of the H "NRZ" signal is thus correctly set.

The NRZ "S" signal obtained at the output of modulator 82 is thereafter processed into a pure logic signal in a circuit comprising an integrator 100, an amplifier 101 supplying sign of the integration result and a the logic circuit 102.

The NRZ "S" signal is thereafter applied a code converter 105 which regenerates the NRZ "L" signal. The NRZ "L" signal is applied to a code converter 106 to the synchronization words from the information and supplies a signal in ARINC form with constant bit rate.

What we claim is:

1. A system for transmitting alignment data from the turret of an aircraft carrier to aircrafts stationed on the flight deck, comprising: optical transmitters with modulable beams placed on the turret, each of the transmitters comprising a plurality of infrared electroluminescent diodes arranged in a line and means for converting the beams from the diodes into a beam substantially parallel to the flight deck with an angle of sight of a few degrees, the transmitters being arranged in such a manner that the adjacent transmitter beams overlap to a large extent; means for modulating the transmitter beam from said data; an optical detector placed on each aircraft, the optical detector being omnidirectional in a plane substantially parallel to the flight deck; and means for demodulating the output signal of said detector.

2. The system according to claim 1, wherein the means for converting the beams from the diodes comprises a parabolic reflector having a focus line parallel to the flight deck, the diodes being disposed on the focus line opposite said reflector.

3. The system according to claim 1, wherein the means for converting the beams from the diodes comprises: a central cylindrical having generatrices opposite the diodes and parallel to the flight deck; two upper and lower cylindrical lens hinged on either side of said central lens; and a reflector associated with a respective one of said upper and lower cylindrical lens.

4. The system according to claim 3, wherein two reflectors forming a dihedron with an edge orthogonal to said generatrices are provided on either side of each diode.

5. The system according to claim 1, wherein each of the detectors comprises photo-diodes forming the lateral faces of a regular prism with an axis substantially perpendicular to the flight deck; and a plurality of plates perpendicular to said axis and regularly spaced apart around said prism, the distance between the consecutive plates and their length being such that the photodiodes are protected against radiations incoming under an angle superior to an angle of site between 5 and 10°.

* * * * *